US012253483B1

(12) United States Patent
Najafi et al.

(10) Patent No.: US 12,253,483 B1
(45) Date of Patent: *Mar. 18, 2025

(54) METHODS AND SYSTEMS FOR MANUFACTURING SEMICONDUCTOR DEVICES

(71) Applicant: PsiQuantum Corp., Palo Alto, CA (US)

(72) Inventors: Faraz Najafi, San Francisco, CA (US); Chia-Jung Chung, Sunnyvale, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/110,848

(22) Filed: Feb. 16, 2023

Related U.S. Application Data (63) Continuation of application No. 16/575,282, filed on Sep. 18, 2019, now Pat. No. 11,719,653.

(60) Provisional application No. 62/734,942, filed on Sep. 21, 2018.

(51) Int. Cl.
  *G01N 23/207* (2018.01)
  *H10N 60/01* (2023.01)
(52) U.S. Cl.
  CPC ..... *G01N 23/2076* (2013.01); *H10N 60/0408* (2023.02); *H10N 60/0436* (2023.02)
(58) Field of Classification Search
  CPC ........... G01N 23/2076; H10N 60/0408; H10N 60/0436
  See application file for complete search history.

(56) References Cited

U.S. PATENT DOCUMENTS

| | | | |
|---|---|---|---|
| 3,059,196 | A | 10/1962 | Lentz |
| 3,119,076 | A | 1/1964 | Schlig et al. |
| 3,283,282 | A | 11/1966 | Rosenberg |
| 4,336,561 | A | 6/1982 | Murphy |
| 4,365,317 | A | 12/1982 | Gheewala |

(Continued)

FOREIGN PATENT DOCUMENTS

| CN | 106289515 A | 1/2017 |
|---|---|---|
| CN | 106549099 A | 3/2017 |

(Continued)

OTHER PUBLICATIONS

Akhlaghi et al., "Gated Mode 145:149 Superconducting Nanowire Single Photon Detectors," Optics Express, vol. 20, No. 2, Jan. 16, 2012, 9 pgs.

(Continued)

*Primary Examiner* — Matthew L Reames
(74) *Attorney, Agent, or Firm* — Morgan, Lewis & Bockius LLP (57) ABSTRACT

The various embodiments described herein include methods for manufacturing superconductor devices. A method for manufacturing superconductors may include: (i) generating spectra data from a first superconductor device; (iii) identifying a first peak ratio between a first phase peak and a second phase peak in the spectra data; (iv) generating additional spectra data from a second superconductor device; (v) identifying a second peak ratio of the additional spectra data from the second superconductor device; (vi) adjusting a manufacturing parameter based on the first peak ratio and the second peak ratio; and (vii) manufacturing a third superconductor device based on the adjusted manufacturing parameter.

14 Claims, 9 Drawing Sheets

(56) References Cited

U.S. PATENT DOCUMENTS

| | | |
|---|---|---|
| 4,509,146 A | 4/1985 | Wang et al. |
| 4,647,954 A | 3/1987 | Graf et al. |
| 4,989,051 A | 1/1991 | Whitehead et al. |
| 5,026,682 A | 6/1991 | Clark et al. |
| 5,030,614 A | 7/1991 | Hollander et al. |
| 5,030,617 A | 7/1991 | Legge |
| 5,041,880 A | 8/1991 | Nojima et al. |
| 5,051,787 A | 9/1991 | Hasegawa |
| 5,053,383 A | 10/1991 | Short et al. |
| 5,127,928 A | 7/1992 | Farries et al. |
| 5,173,620 A | 12/1992 | Fujimaki et al. |
| 5,219,826 A | 6/1993 | Kapitulnik |
| 5,247,475 A | 9/1993 | Hasunuma et al. |
| 5,321,004 A | 6/1994 | Perez et al. |
| 5,365,476 A | 11/1994 | Mukhanov |
| 5,376,626 A | 12/1994 | Drehman et al. |
| 5,455,519 A | 10/1995 | Ohori |
| 5,481,119 A | 1/1996 | Higashino et al. |
| 5,521,862 A | 5/1996 | Frazier |
| 5,574,290 A | 11/1996 | You |
| 5,719,105 A | 2/1998 | Odagawa et al. |
| 5,825,240 A | 10/1998 | Geis et al. |
| 5,831,278 A | 11/1998 | Berkowitz |
| 5,892,644 A | 4/1999 | Evans |
| 5,925,892 A | 7/1999 | Mizuno et al. |
| 6,029,075 A | 2/2000 | Das et al. |
| 6,078,517 A | 6/2000 | Herr |
| 6,242,939 B1 | 6/2001 | Nagasawa |
| 6,433,974 B2 | 8/2002 | Heismann |
| 6,774,463 B1 | 8/2004 | Chaudhari et al. |
| 6,900,714 B1 | 5/2005 | Huang et al. |
| 7,227,438 B2 | 6/2007 | Song et al. |
| 7,513,765 B2 | 4/2009 | Liao |
| 7,558,030 B2 | 7/2009 | Lee et al. |
| 7,589,323 B2 | 9/2009 | Tanaka et al. |
| 7,724,083 B2 | 5/2010 | Herring et al. |
| 7,847,282 B2 | 12/2010 | Sandhu |
| 7,852,106 B2 | 12/2010 | Herr et al. |
| 8,330,145 B2 | 12/2012 | Wakana et al. |
| 8,565,844 B2 | 10/2013 | Smith |
| 8,577,430 B1 | 11/2013 | Smith |
| 8,736,085 B2 | 5/2014 | Sines |
| 9,293,240 B2 | 3/2016 | Kroulik |
| 9,443,576 B1 | 9/2016 | Miller |
| 9,500,519 B2 | 11/2016 | Tang et al. |
| 9,509,315 B2 | 11/2016 | McCaughan et al. |
| 9,853,645 B1 | 12/2017 | Mukhanov et al. |
| 9,876,505 B1 | 1/2018 | Dai et al. |
| 9,954,158 B2 | 4/2018 | You et al. |
| 9,998,122 B2 | 6/2018 | Hamilton et al. |
| 10,103,736 B1 | 10/2018 | Powell et al. |
| 10,133,986 B1 | 11/2018 | Newton et al. |
| 10,171,086 B2 | 1/2019 | McCaughan et al. |
| 10,177,298 B1 | 1/2019 | Taylor et al. |
| 10,186,858 B2 | 1/2019 | Klaus et al. |
| 10,197,440 B2 | 2/2019 | Najafi |
| 10,262,776 B2 | 4/2019 | Choi et al. |
| 10,361,703 B2 | 7/2019 | Najafi |
| 10,386,229 B2 | 8/2019 | Najafi et al. |
| 10,396,733 B2 | 8/2019 | Najafi et al. |
| 10,454,014 B2 | 10/2019 | Najafi et al. |
| 10,454,016 B2 | 10/2019 | Fong et al. |
| 10,566,516 B2 | 2/2020 | Najafi |
| 10,573,800 B1 | 2/2020 | Najafi |
| 10,586,910 B2 | 3/2020 | Najafi |
| 10,620,044 B2 | 4/2020 | Thompson et al. |
| 10,651,325 B2 | 5/2020 | Najafi et al. |
| 10,879,905 B2 | 12/2020 | Najafi et al. |
| 10,897,235 B2 | 1/2021 | Najafi et al. |
| 10,911,031 B2 | 2/2021 | Wise et al. |
| 10,944,403 B2 | 3/2021 | Najafi |
| 10,984,857 B2 | 4/2021 | Najafi |
| 11,009,387 B2 | 5/2021 | Chung et al. |
| 2002/0149453 A1 | 10/2002 | Snitchler et al. |
| 2003/0087503 A1 | 5/2003 | Sakaguchi et al. |
| 2005/0153843 A1 | 7/2005 | Kubota |
| 2005/0197254 A1 | 9/2005 | Stasiak et al. |
| 2006/0073979 A1 | 4/2006 | Thieme et al. |
| 2006/0183327 A1 | 8/2006 | Moon |
| 2006/0270224 A1 | 11/2006 | Song et al. |
| 2008/0026234 A1 | 1/2008 | Sambasivan et al. |
| 2008/0197285 A1 | 8/2008 | Frey et al. |
| 2008/0272302 A1 | 11/2008 | Frey et al. |
| 2009/0014433 A1 | 1/2009 | O'Neil et al. |
| 2010/0026447 A1 | 2/2010 | Keefe et al. |
| 2010/0171098 A1 | 7/2010 | Suzuki |
| 2011/0108803 A1 | 5/2011 | Deligianni et al. |
| 2011/0116742 A1 | 5/2011 | Chang et al. |
| 2011/0254053 A1 | 10/2011 | Goupil et al. |
| 2013/0012392 A1 | 1/2013 | Tanaka et al. |
| 2013/0090244 A1 | 4/2013 | Shinzato et al. |
| 2013/0124112 A1 | 5/2013 | Heath et al. |
| 2013/0143744 A1 | 6/2013 | Marsili et al. |
| 2013/0150247 A1 | 6/2013 | Reeves et al. |
| 2013/0341594 A1 | 12/2013 | Mohseni et al. |
| 2014/0113828 A1 | 4/2014 | Gilbert et al. |
| 2014/0299751 A1 | 10/2014 | Tang et al. |
| 2015/0018218 A1 | 1/2015 | Lakrimi et al. |
| 2015/0179916 A1 | 6/2015 | Pramanik et al. |
| 2015/0348681 A1 | 12/2015 | Huh |
| 2016/0028402 A1 | 1/2016 | McCaughan et al. |
| 2016/0028403 A1 | 1/2016 | McCughan et al. |
| 2016/0356708 A1 | 12/2016 | Bennett et al. |
| 2017/0186933 A1 | 6/2017 | Sunter et al. |
| 2018/0033944 A1 | 2/2018 | Ladizinsky et al. |
| 2018/0145664 A1 | 5/2018 | Herr et al. |
| 2018/0335343 A1 | 11/2018 | Najafi et al. |
| 2018/0364097 A1 | 12/2018 | Najafi |
| 2018/0374979 A1 | 12/2018 | Nozawa |
| 2019/0027672 A1 | 1/2019 | Megrant |
| 2019/0035904 A1 | 1/2019 | Najafi |
| 2019/0035999 A1 | 1/2019 | Najafi |
| 2019/0044051 A1 | 2/2019 | Caudillo et al. |
| 2019/0109595 A1 | 4/2019 | Najafi |
| 2019/0148848 A1 | 5/2019 | Najafi et al. |
| 2019/0227230 A1 | 7/2019 | Novack et al. |
| 2019/0288132 A1 | 9/2019 | Wang et al. |
| 2019/0378874 A1 | 12/2019 | Rosenblatt et al. |
| 2020/0066962 A1 | 2/2020 | Najafi |
| 2020/0080890 A1 | 3/2020 | Najafi et al. |
| 2020/0111944 A1 | 4/2020 | Moodera et al. |
| 2020/0176662 A1 | 6/2020 | Dayton et al. |
| 2020/0194656 A1 | 6/2020 | Najafi |
| 2020/0256722 A1 | 8/2020 | Najafi et al. |
| 2021/0183767 A1 | 6/2021 | Najafi et al. |
| 2021/0239518 A1 | 8/2021 | Chung et al. |

FOREIGN PATENT DOCUMENTS

| | | |
|---|---|---|
| DE | 2440576 B1 | 1/1976 |
| DE | 19714191 C1 | 7/1998 |
| EP | 0299879 A2 | 1/1989 |
| EP | 1965184 A1 | 9/2008 |
| GB | 2530500 A | 3/2016 |
| JP | S63299282 A | 12/1988 |
| JP | H0555647 A | 3/1993 |
| WO | WO90/14715 A1 | 11/1990 |
| WO | WO94/09566 A1 | 4/1994 |
| WO | WO/2012052628 A1 | 4/2012 |

OTHER PUBLICATIONS

Atikian, Haig A. et al., "Superconducting Nanowire Single Photon Detector on Diamond," arXiv:1401.4490v1, physics.optics, Jan. 17, 2014, 5 pgs.

Cheng, Risheng et al., "Photon-Number-Resolving Detector Based on Superconducting Serial Nanowires," IEEE Transactions on Applied Superconductivity, vol. 23, No. 1, Feb. 2013, 9 pgs.

Clem, John R. et al., "Geometry-dependent critical currents in superconducting nanocircuits," arXiv:1109.4881v1 [cond-mat.supr-con] Sep. 22, 2011, 29 pgs.

(56) References Cited

OTHER PUBLICATIONS

Dai, Daoxin et al., "Mode conversion in tapered submicron silicon ridge optical waveguides," Optics Express, vol. 20, No. 12, Jun. 4, 2012, 15 pgs.
Henrich, D. et al., "Geometry-inducted reduction of the critical current in superconducting nanowires," arXiv:1204.0616v2 [cond-mat-supr-con] Aug. 22, 2012, 6 pgs.
Hortensius, H.L. et al., "Critical-Current Reduction in Thin Superconducting Wires Due to Current Crowding," arXiv:1203.4253v3, [cond-mat-supr-con], May 6, 2012, 5 pgs.
Korzh, B.A. et al., "Demonstrating sub-3 ps temporal resolution in a superconducting nanowire single-photon detector," Apr. 18, 2018, 26 pgs.
Lee, S.-B. et al., "Fabrication of a self-aligned superconducting nanotransistor based NOR logic gate," Microelectronic Engineering 57-58, 2001, 7 pgs., downloaded from https://www.sciencedirect.com/science/article/abs/pii/S0167931701004269).
Marsili, F., "Single-photon detectors based on ultra-narrow superconducting nanowires," Massachusetts Institute of Technology, Department of Electrical Engineering and Computer Science, Dec. 19, 2010, 31 pgs.
Mattioli, Francesco et al., "Photon-number-resolving superconducting nanowire detectors," Superconductor Science and Technology, Aug. 24, 2015, 16 pgs.
McGaughan, "Superconducting thin film nanoelectronics," Sep. 2015, Massachusetts Institute of Technology, submitted to the Department of Electrical Engineering and Computer Science in partial fulfillment of the requirements for the degree of Doctor of Philosopy in Electrical Engineering, 22 pgs.
Murphy et al., "Nanoscale superconducting memory based on the kinetic inductance of asymmetric nanowire loops," Department of Physics, University of Illinois at Urbana-Champaign, arXiv:1701.08715v2 [cond-mat.supr-con] Jun. 29, 2017, 19 pgs.
Natarajan et al., "Superconducting nanowire single-photon detectors: physics and applications", 2012, Superconduc. Sci. Technology vol. 25, 17 pgs.
Quaranta et al., Superconductive Three-Terminal Amplifier/Discriminator, IEEE Transactions on Applied Superconductivity, vol. 19, No. 3, Jun. 2, 2009, 4 pgs.
Schmidt, E. et al., AIN-Buffered Superconducting NbN Nanowire Single-Photon Detector on GaAs, IEEE Transactions on Applied Superconductivity, vol. 27, No. 4, Jun. 2017, 5 pgs.
Shiino, Tatsuya et al., "Improvement of Critical Temperature of Superconducting NbTiN and NbN Thin Films Using the AIN Buffer Layer," Superconductor Science and Technology, Mar. 2010, 11 pgs.
Zhao, Qing-Yuan et al., "A compact superconducting nanowire memory element operated by nanowire cryotrons," Massachusetts Institute of Technology, Department of Electrical Engineering and Computer Science, Nov. 22, 2017, 20 pgs.
McCaughan, A.N., et al., "Using Geometry to Sense Current," Nano Letters 16 (2016), 6 pgs.
Stanfield, CMOS-Compatible, Piezo-Optomechanically Tunable Photonics for Visible Wavelengths and Cryogenic, Temperatures, vol. 27, Issue 20, pp. 28588-28605, 2019, 18 pgs.
Saraswat, "Highly oriented, free-standing, superconducting NbN films growth on chemical vapor deposited graphene," APL Materials 2, 056103 (2014); https://doi.org/10.1063/1.4875356 (Year: 2014), 7 pgs.
PsiQuantum Corp., International Search Report and Written Opinion, PCT/US2018/033042, Aug. 28, 2018, 13 pgs.
PsiQuantum Corp., International Search Report and Written Opinion, PCT/US2018/033041, Jul. 27, 2018, 16 pgs.
PsiQuantum Corp., International Search Report and Written Opinion, PCT/US2018/044091, Nov. 7, 2018, 12 pgs.
PsiQuantum Corp., Invitation to Pay Additional Fees/Partial Search Report, PCT/US2018/037892, Aug. 20, 2018, 12 pgs.
PsiQuantum Corp., Invitation to Pay Additional Fees/Partial Search Report, PCT/US2018/054414, Jan. 24, 2019, 21 pgs.
PsiQuantum Corp., International Search Report and Written Opinion, PCT/US2018/054414, Mar. 20, 2019, 21 pgs.
Najafi, Office Action dated Dec. 12, 2018, U.S. Appl. No. 16/028,288, 6 pgs.
Najafi, Notice of Allowance dated Apr. 5, 2019, U.S. Appl. No. 16/028,288, 10 pgs.
Najafi, Office Action dated Sep. 21, 2018, U.S. Appl. No. 16/028,293, 8 pgs.
Najafi, Final Office Action dated Mar. 1, 2019 U.S. Appl. No. 16/028,293, 5 pgs.
Najafi, Notice of Allowance dated Sep. 21, 2018, U.S. Appl. No. 16/012,520, 9 pgs.
Najafi, Quayle Office Action, U.S. Appl. No. 16/151,180, Jan. 31, 2019, 5pgs.
Najafi, Notice of Allowace, U.S. Appl. No. 16/151,180, Mar. 14, 2019, 5 pgs.
Najafi, Notice of Allowance U.S. Appl. No. 16/151,190, dated Feb. 6, 2019, 11 pgs.
Najafi, Notice of Allowance U.S. Appl. No. 16/151,190, dated Mar. 28, 2019, 5 pgs.
Najafi, Office Action, U.S. Appl. No. 16/046,815, Feb. 4, 2019, 9 pgs.
Najafi, Office Action, U.S. Appl. No. 16/046,807, Mar. 18, 2019, 10 pgs.
Najafi, Office Action, U.S. Appl. No. 16/107,143, Mar. 19, 2019, 11 pgs.
PsiQuantum Corp., International Search Report and Written Opinion, PCT/US2019/017687, Apr. 30, 2019, 8 pgs.
PsiQuantum Corp., International Search Report, PCT/US2019/017691, Apr. 23, 2019, 7 pgs.
PsiQuantum Corp., International Search Report and Written Opinion, PCT/US2019/030019, Jul. 17, 2019, 8 pgs.
PsiQuantum Corp., PCT/US2018/044091, International Preliminary Report on Patentability, Jan. 28, 2020, 6 pgs.
Najafi, Non-Final Office Action, U.S. Appl. No. 16/664,716, Apr. 1, 2020, 14 pgs.
PsiQuantum, International Search Report and Written Opinion, PCT/US2019/051853, Jan. 27, 2020, 13 pgs.
PsiQuantum, International Preliminary Report on Patentability, PCT/US12018/033041, Nov. 26, 2019, 8 pgs.
PsiQuantum, International Preliminary Report on Patentability, PCT/US2018/054414, Apr. 8, 2020, 15 pgs.
PsiQuantum, International Search Report / Written Opinion, PCT/US2018/037892, Oct. 17, 2018, 18 pgs.
PsiQuantum, International Preliminary Report on Patentability, PCT/US2018/037892, Dec. 17, 2019, 12 pgs.
Najafi, Non-Final Office Action, U.S. Appl. No. 16/553,068, Apr. 1, 2020, 11 pgs.
Najafi, Non-Final Office Action, U.S. Appl. No. 16/544,718, Aug. 17, 2020, 6 pgs.
Najafi, Non-Final Office Action, U.S. Appl. No. 16/656,506, Aug. 13, 2020, 18 pgs.
Najafi, Notice of Allowance, U.S. Appl. No. 16/553,068, Sep. 18, 2020, 8 pgs.
Najafi, Notice of Allowance, U.S. Appl. No. 16/473,550, Sep. 24, 2020, 8 pgs.
Najafi, Corrected Notice of Allowability, U.S. Appl. No. 16/473,550, Nov. 3, 2020, 2 pgs.
Najafi, Corrected Notice of Allowability, U.S. Appl. No. 16/553,068, Nov. 12, 2020, 2 pgs.
Najafi, Notice of Allowance, U.S. Appl. No. 16/656,506, Nov. 3, 2020, 12 pgs.
Najafi, Final Office Action, U.S. Appl. No. 16/664,716, Oct. 16, 2020, 14 pgs.
Najafi, Notice of Allowance, U.S. Appl. No. 16/473,547, Dec. 9, 2020, 8 pgs.
Najafi, Notice of Allowance, U.S. Appl. No. 16/543,256, Dec. 9, 2020, 12 pgs.
Chung, Non-Final Office Action, U.S. Appl. No. 16/849,829, Aug. 21, 2020, 5 pgs.
Chung, Notice of Allowance, U.S. Appl. No. 16/849,829, Dec. 8, 2020, 5 pgs.

(56) References Cited

OTHER PUBLICATIONS

PsiQuantum Corp., International Search Report and Written Opinion, PCT/US20/28519, Jan. 12, 2021, 9 pgs.
PsiQuantum Corp., Notice of Allowance, U.S. Appl. No. 16/849,829, Mar. 1, 2021, 8 pgs.
PsiQuantum Corp., Notice of Allowance, U.S. Appl. No. 16/544,718, Feb. 5, 2021, 6 pgs.
PsiQuantum Corp., Notice of Allowance, U.S. Appl. No. 16/664,716, Jan. 28, 2021, 8 pgs.
PsiQuantum Corp., Notice of Allowance, U.S. Appl. No. 16/473,547, Jan. 27, 2021, 2 pgs.
PsiQuantum Corp., Notice of Allowance, U.S. Appl. No. 16/543,256, Feb. 4, 2021, 2 pgs.
PsiQuantum Corp., Corrected Notice of Allowability, U.S. Appl. No. 16/544,718, Mar. 12, 2021, 2 pgs.
PsiQuantum Corp., Corrected Notice of Allowability, U.S. Appl. No. 16/544,718, Mar. 24, 2021, 2 pgs.
PsiQuantum Corp., Corrected Notice of Allowability, U.S. Appl. No. 16/849,829, Apr. 5, 2021, 2 pgs.
PsiQuantum, Notice of Allowance, U.S. Appl. No. 16/840,166, Mar. 23, 2021, 7 pgs.
PsiQuantum, Notice of Allowance, U.S. Appl. No. 16/544,718, Apr. 26, 2021, 2 pgs.
PsiQuantum, Notice of Allowance, U.S. Appl. No. 16/664,716, Apr. 21, 2021, 8 pgs.
PsiQuantum, Corrected Notice of Allowability, U.S. Appl. No. 16/664,716, May 7, 2021, 2 pgs.
PsiQuantum, Corrected Notice of Allowability, U.S. Appl. No. 16/543,256, Mar. 24, 2021, 2 pgs.
PsiQuantum, Notice of Allowance, U.S. Appl. No. 16/575,274, Apr. 22, 2021, 10 pgs.
PsiQuantum, International Preliminary Report on Patentability, PCT/US2018/033042, Nov. 19, 2019, 7 pgs.
PsiQuantum, International Search Report, PCT/US2018/033041, Jul. 27, 2018, 12 pgs.
PsiQuantum, International Preliminary Report on Patentability, PCT/US2019/051853, Mar. 23, 2021, 10 pgs.
PsiQuantum, International Preliminary Report on Patentability, PCT/US2019/017687, Aug. 18, 2020, 6 pgs.
PsiQuantum, International Preliminary Report on Patentability, PCT/US2019/030019, Nov. 3, 2020, 7 pgs.
PsiQuantum, Notice of Allowance, U.S. Appl. No. 16/840,166, May 24, 2021, 5 pgs.
Najafi, Corrected Notice of Allowability, U.S. Appl. No. 16/840,166, Jul. 21, 2021, 2 pgs.
Najafi, Non-Final Office Action, U.S. Appl. No. 17/135,861, Sep. 23, 2021, 6 pgs.
PsiQuantum, International Preliminary Report on Patentability, PCT/US2019/016885, Aug. 11, 2020, 7 pgs.
PsiQuantum, International Search Report and Written Opinion, PCT/US2019/016885, Apr. 24, 2019, 9 pgs.
Thompson, Non-Final Office Action, U.S. Appl. No. 16/450,911, Aug. 2, 2019, 6 pgs.
Thompson, Notice of Allowance, U.S. Appl. No. 16/450,911, Dec. 11, 2019, 5 pgs.
Thompson, Non-Final Office Action, U.S. Appl. No. 16/985,137, Sep. 30, 2021, 6 pgs.
Thompson, Notice of Allowance, U.S. Appl. No. 16/985,137, May 26, 2022, 9 pgs.
Najafi, Notice of Allowance, U.S. Appl. No. 16/046,807, Oct. 29, 2019, 7 pgs.
Najafi, Non-Final Office Action, U.S. Appl. No. 16/136,124, Apr. 4, 2019, 8 pgs.
Najafi, Notice of Allowance, U.S. Appl. No. 16/136,124, Jun. 27, 2019, 8 pgs.
Najafi, Corrected Notice of Allowability, U.S. Appl. No. 16/136,124, Sep. 23, 2019, 2 pgs.
PsiQuantum Corp., International Search Report and Written Opinion, PCT/US2018/060802, Apr. 8, 2019, 18 pgs.
PsiQuantum, International Preliminary Report on Patentability, PCT/US2018/060802, May 19, 2020, 13 pgs.
Najafi, Notice of Allowance, U.S. Appl. No. 16/773,921, Sep. 22, 2021, 8 pgs.
Najafi, Notice of Allowance, U.S. Appl. No. 17/195,522, Nov. 12, 2021, 8 pgs.
Najafi, Corrected Notice of Allowability, U.S. Appl. No. 17/195,522, Nov. 16, 2021, 2 pgs.
Najafi, Notice of Allowance, U.S. Appl. No. 16/773,921, Nov. 15, 2021, 8 pgs.
Najafi, Notice of Allowance, U.S. Appl. No. 17/033,337, Dec. 9, 2021, 8 pgs.
Chung, Non-Final Office Action, U.S. Appl. No. 17/232,086, Dec. 16, 2021, 6 pgs.
Chung, Notice of Allowance, U.S. Appl. No. 17/232,086, May 11, 2022, 6 pgs.
Najafi, Corrected Notice of Allowability, U.S. Appl. No. 17/195,522, Dec. 9, 2021, 2 pgs.
Najafi, Corrected Notice of Allowability, U.S. Appl. No. 16/773,921, Dec. 24, 2021, 2 pgs.
Najafi, Corrected Notice of Allowability, U.S. Appl. No. 17/195,522, Jan. 7, 2022, 2 pgs.
Najafi, Notice of Allowance, U.S. Appl. No. 17/135,861, Jan. 28, 2022, 7 pgs.
Thompson, Non-Final Office Action, U.S. Appl. No. 16/985,137, Jan. 18, 2022, 8 pgs.
Najafi, Notice of Allowance, U.S. Appl. No. 16/623,503, Feb. 22, 2022, 10 pgs.
Najafi, Corrected Notice of Allowability, U.S. Appl. No. 17/195,522, Feb. 9, 2022, 2 pgs.
Najafi, Non-Final Office Action, U.S. Appl. No. 16/813,628, Mar. 7, 2022, 7 pgs.
Najafi, Notice of Allowance, U.S. Appl. No. 17/033,337, Feb. 25, 2022, 7 pgs.
Najafi, Corrected Notice of Allowability, U.S. Appl. No. 17/033,337, Mar. 16, 2022, 2 pgs.
Najafi, Corrected Notice of Allowability, U.S. Appl. No. 17/135,861, Mar. 15, 2022, 2 pgs.
Najafi, Corrected Notice of Allowability, U.S. Appl. No. 16/623,503, Mar. 11, 2022, 3 pgs.
Najafi, Corrected Notice of Allowability, U.S. Appl. No. 16/623,503, Mar. 22, 2022, 3 pgs.
Najafi, Non-Final Office Action, U.S. Appl. No. 17/160,283, Mar. 31, 2022, 17 pgs.
Najafi, Non-Final Office Action, U.S. Appl. No. 17/234,701, Feb. 1, 2022, 13 pgs.
Najafi, Notice of Allowance, U.S. Appl. No. 17/234,701, Jun. 6, 2022, 9 pgs.
Najafi, Non-Final Office Action, U.S. Appl. No. 16/840,182, Apr. 29, 2022, 12 pgs.
Najafi, Notice of Allowance, U.S. Appl. No. 17/135,861, Feb. 15, 2022, 2 pgs.
Najafi, Notice of Allowance, U.S. Appl. No. 16/773,921, Feb. 16, 2022, 2 pgs.
Najafi, Non-Final Office Action, U.S. Appl. No. 16/575,282, Jul. 26, 2022, 10 pgs.
Najafi, Notice of Allowance, U.S. Appl. No. 16/575,282, 2002 Nov. 2022, 7 pgs.

METHODS AND SYSTEMS FOR MANUFACTURING SEMICONDUCTOR DEVICES

RELATED APPLICATIONS

This application is a continuation of U.S. patent application Ser. No. 16/575,282, filed Sep. 18, 2019, which claims priority to U.S. Provisional Patent Application No. 62/734,942, filed Sep. 21, 2018, each of which is hereby incorporated by reference in its entirety.

TECHNICAL FIELD

This relates generally to superconducting devices, including but not limited to, the manufacture of superconductor devices.

BACKGROUND

Superconductors are materials capable of operating in a superconducting state with zero electrical resistance under particular conditions. Conventional methods and systems for manufacturing superconductors require temperatures in excess of 800 degrees Celsius, which may cause dopant migration in doped silicon and complementary metal-oxide-semiconductor (CMOS) structures. In addition, conventional methods and systems for manufacturing superconductors utilize non-CMOS substrates, such as magnesium oxide substrates, that may not be suitable for wafer-level fabrication. Moreover, conventionally-manufactured superconductors degrade or fail in high temperature (e.g., in excess of 100 degrees Celsius) environments after manufacture. These limitations on conventional means of manufacturing superconductors make integration between superconductor and CMOS structures challenging or impossible in some circumstances.

SUMMARY

There is a need for more efficient and effective systems and methods for manufacturing superconductors (e.g., utilizing CMOS systems and processes). Such systems and methods optionally complement or replace conventional methods for manufacturing superconductors.

In one aspect, some embodiments include a method of manufacturing a superconductor, including: (1) manufacturing a first superconductor device; (2) characterizing the first superconductor device, including: (a) obtaining x-ray diffraction spectra of the first superconductor device; and (b) identifying a ratio of a first cubic phase peak to a second cubic phase peak in the x-ray diffraction spectra; (3) adjusting a manufacturing parameter based on the identified ratio; and (4) manufacturing a second superconductor device with the adjusted manufacturing parameter.

In some embodiments, manufacturing the first superconductor device includes: (1) obtaining a substrate composed of silicon; (2) depositing a first layer on the substrate, the first layer composed of silicon and nitrogen; and (3) depositing a superconductor layer on the first layer, the superconductor layer composed of niobium nitride. In some embodiments, the manufacturing is performed with CMOS BEOL (CMOS back-end-of-line) processes and tools (e.g., a 200 mm+ CMOS tool). In some embodiments, the substrate is a 6 inch, 8 inch, or 13 inch silicon wafer.

In another aspect, some embodiments include a superconductor device, including: (1) a substrate composed of silicon; (2) a first layer on the substrate, the first layer composed of silicon and nitrogen; (3) a second layer on the first layer, the second layer composed of aluminum and nitrogen; (4) a superconductor layer on the second layer, the superconductor composed of niobium and nitrogen; and (5) a protective layer on the superconductor layer, the protective layer composed of aluminum and nitrogen. In some embodiments, the first layer has a thickness in the range of 5 nanometers (nm) to 500 nm. In some embodiments, the second layer has a thickness in the range of 3 nm to 50 nm. In some embodiments, the superconductor layer has a thickness in the range of 5 nm to 20 nm. In some embodiments, the protective layer has a thickness in the range of 1 nm to 5 nm.

Thus, more efficient, effective, and accurate systems and methods are provided for manufacturing superconductor devices.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

Many superconductors require very low temperatures to operate in a superconducting state. However, operating superconducting circuitry at these low temperatures can be challenging. Achieving temperatures near absolute zero (e.g., via the use of lasers and/or magnetic fields), such as less than 1 Kelvin (K), 1-2 Kelvin, or 2-3 Kelvin, often requires high performance cooling systems that are large and costly. In particular, the challenges become significant as the desired temperature approaches zero. In addition, it is difficult to maintain the near-zero temperature due to high cooling power needed for reliable operation of many superconducting circuits. Therefore, there is a need for superconducting circuitry that is capable of operating in a superconducting state at higher temperatures (e.g., 3-4 Kelvin, 4-5 Kelvin, 5-10 Kelvin, etc.) and having consistent efficiency throughout an operational temperature range (e.g., 3-6 Kelvin). Moreover, there is a great need for manufacturing systems and methods to consistently and efficiently manufacture such superconducting circuitry.

Figure 1A:
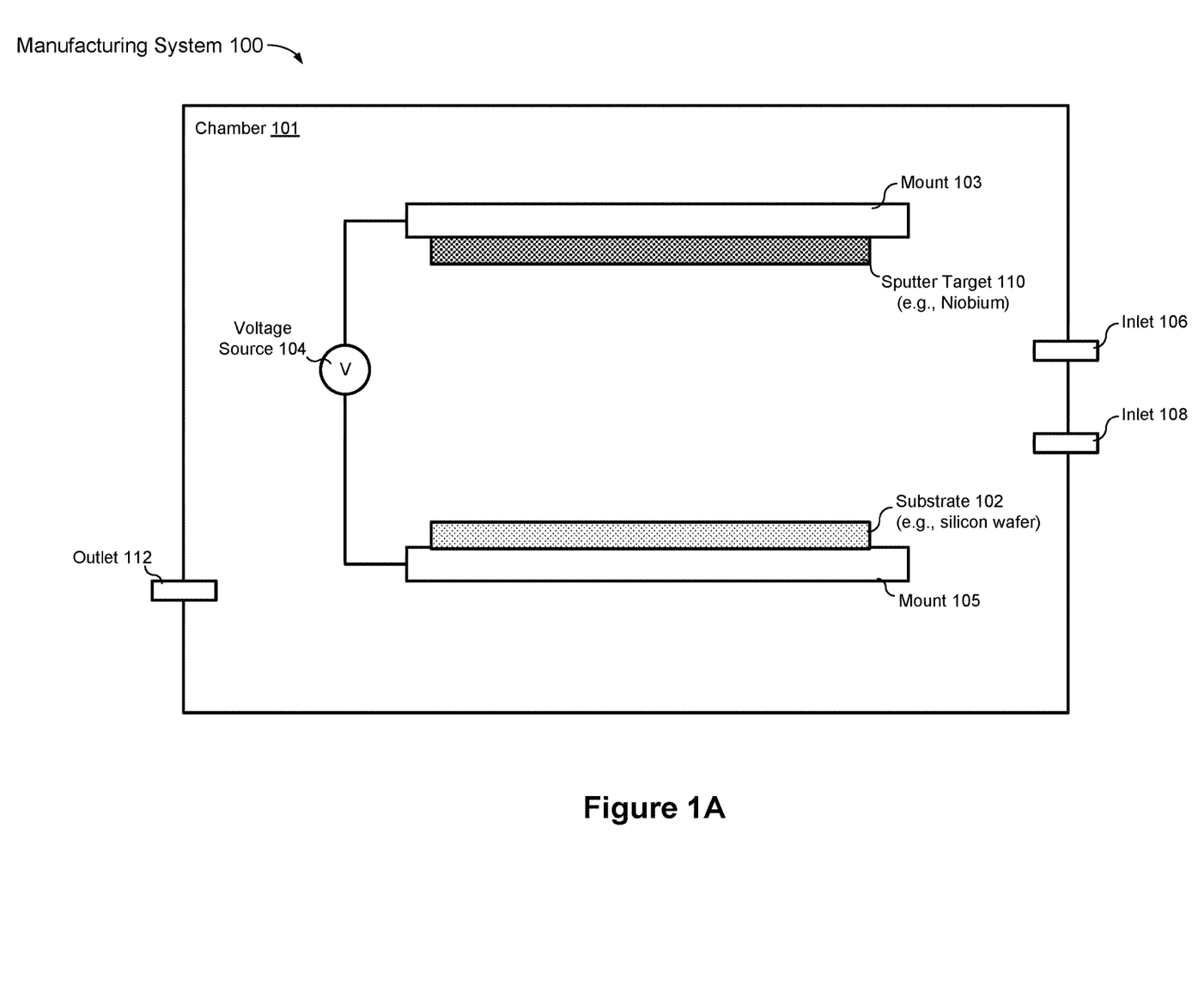
FIGS. 1A-1B are diagrams illustrating a representative manufacturing system in accordance with some embodiments.
Figure 1B:
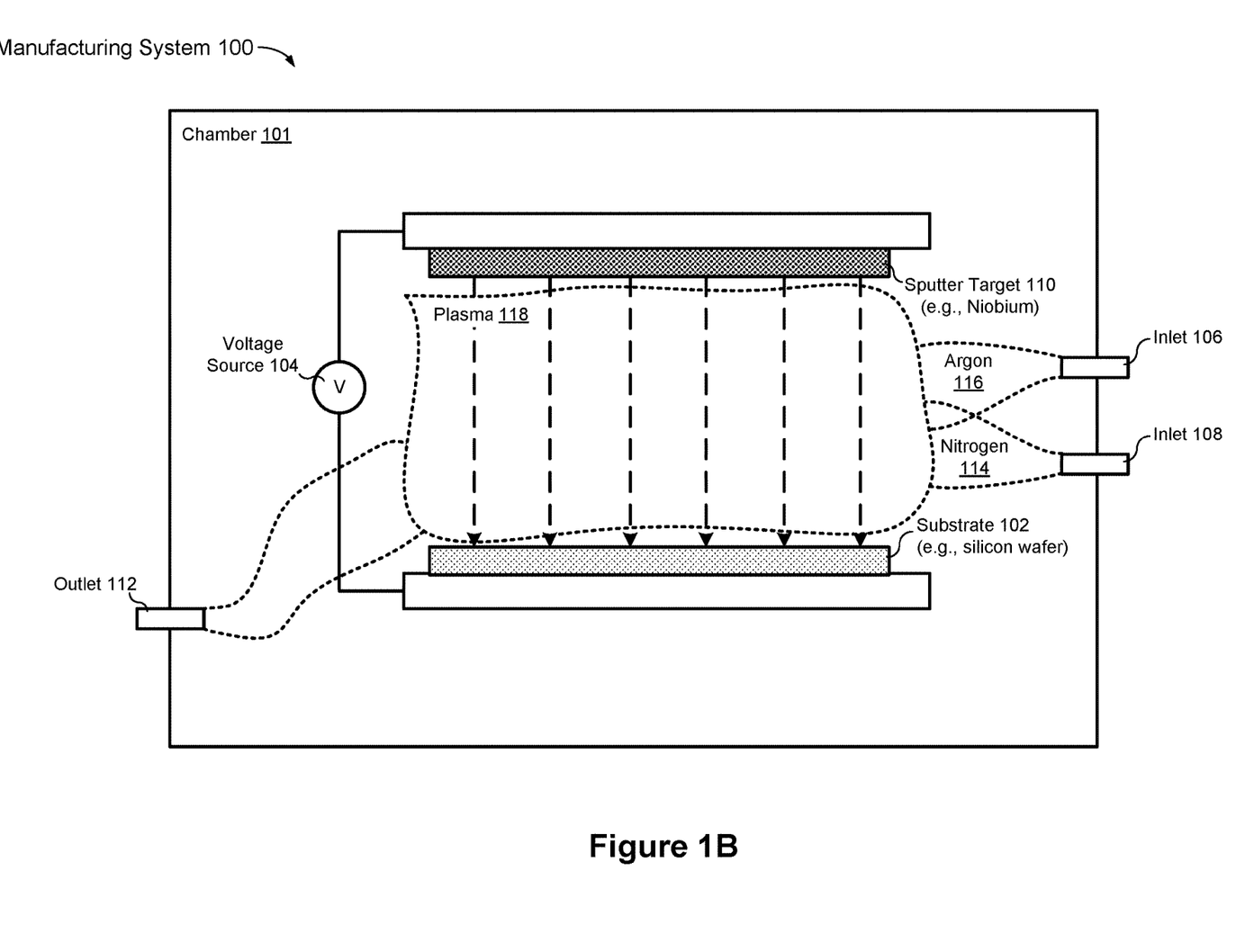

FIGS. 1A-1B are diagrams illustrating a manufacturing system 100 in accordance with some embodiments. As shown in FIG. 1A, the manufacturing system includes a chamber 101 having multiple inlets (e.g., inlets 106 and 108) and an outlet 112. In accordance with some embodiments, an apparatus within the chamber 101 includes a mount 105 for holding a substrate 102 (e.g., a silicon wafer) and a mount 103 for holding and positioning a sputter target 110 (e.g., niobium material) above the substrate 102. In accordance with some embodiments, the apparatus includes a voltage source 104 electrically-coupling the mounts 105 and 103. In some embodiments, the manufacturing system 100 is a CMOS system (e.g., a CMOS back-end-of-line (BEOL) system). In some embodiments, the manufacturing system 100 is a 200+ millimeter (mm) CMOS system.

Figure 4A:
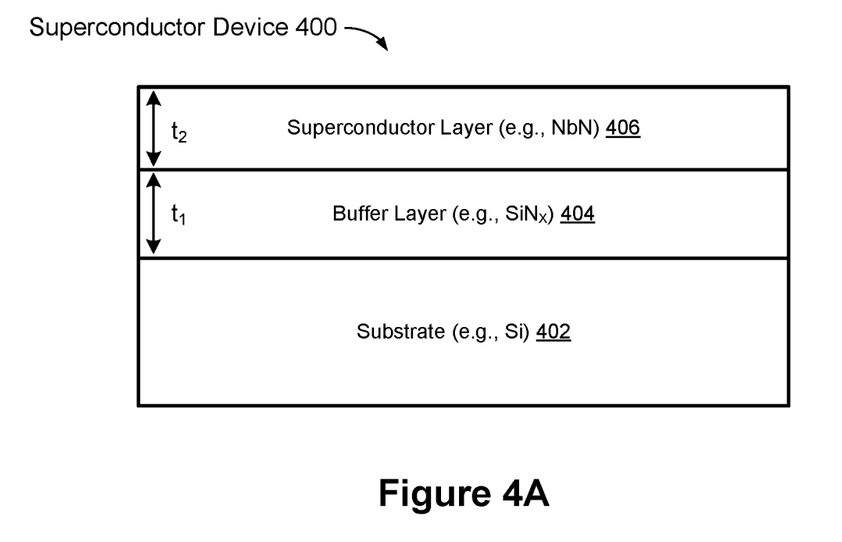
FIGS. 4A-4B are cross-sectional diagrams illustrating representative superconductor devices in accordance with some embodiments.
Figure 4B:
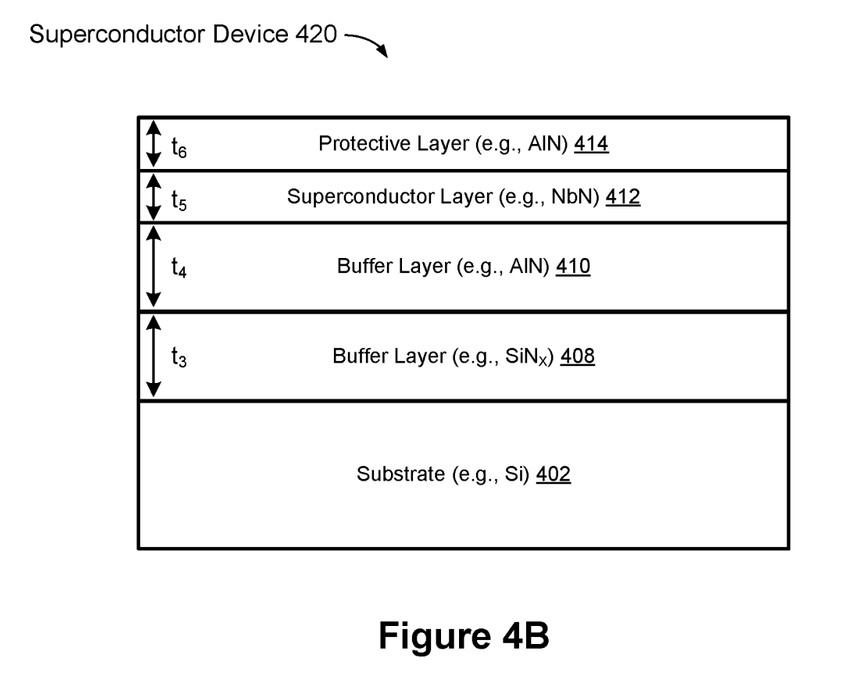

FIG. 1B shows deposition of a superconducting layer on the substrate 102 (e.g., via a physical vapor deposition process) in accordance with some embodiments. In some embodiments, a buffer layer (e.g. composed of SiN) is deposited prior to deposition of the superconducting layer, e.g., as illustrated in FIGS. 4A-4B. In some embodiments, the buffer layer is deposited via a chemical vapor deposition (CVD) process. FIG. 1B shows argon 116 entering the chamber 101 via a first inlet (e.g., the inlet 106), nitrogen 114 entering the chamber 101 via a second inlet (e.g., the inlet 108), and argon and nitrogen leaving the chamber 101 via the outlet 112. In some embodiments, the inlets and/or the outlet 112 include valves (e.g., check valves) configured to (1) prevent reverse flow, (2) regulate a pressure within the chamber 101, and/or (3) adjust relative percentages of the argon 116 and the nitrogen 114. Although FIG. 1B shows argon 116, in some embodiments, argon 116 is replaced with a different noble gas (e.g., helium, neon, or krypton).

FIG. 1B further shows a plasma 118 forming between the sputter target 110 and the substrate 102 in accordance with some embodiments. In some embodiments, conditions within the manufacturing system 100 are adapted such that the plasma 118 forms between the sputter target 110 and the substrate 102. For example, total pressure within the chamber 101 is maintained in the range of 10 milliTorr (mT) to 24 mT, or 12 mT to 15 mT. In some embodiments, the manufacturing system 100 is configured to operate in a first processing state, such as a processing state defined by process region 202 (FIG. 2A) and process region 204 (FIG. 2B), during deposition of a superconducting layer (e.g., composed of NbN) on the substrate 102. In some embodiments, the substrate 102 is maintained at a temperature between 300 degrees Celsius and 400 degrees Celsius during deposition of the superconducting layer.

In some embodiments, conditions within the manufacturing system 100 are adapted such that niobium from the sputter target 110 transfers to the substrate 102. For example, the voltage source 104 is maintained in the 2000 Watt (W) to 4000 W range with a duty cycle between 40% and 70%.

In accordance with some embodiments, during transfer to the substrate 102, the niobium from the sputter target 110 combines with nitrogen in the plasma 118 to form niobium nitride (NbN), and the NbN is deposited on the substrate 102.

Figure 2A:
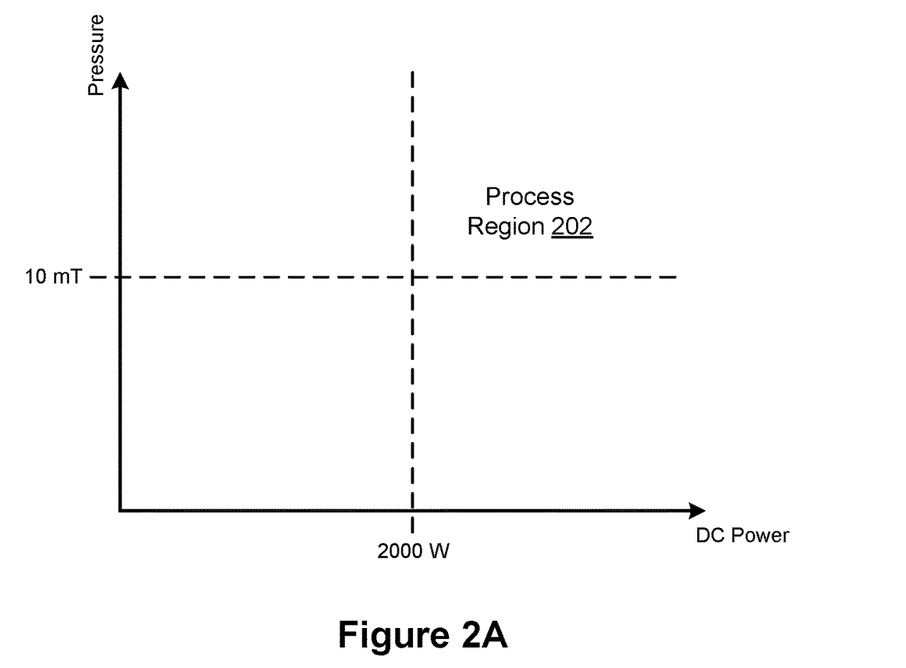
FIGS. 2A-2B are diagrams illustrating representative processing regions for manufacturing a superconductor device in accordance with some embodiments.

FIGS. 2A-2B are diagrams illustrating representative processing regions for manufacturing a superconductor device in accordance with some embodiments. FIG. 2A shows a process region 202 for deposition of a superconductor layer via a physical vapor deposition (PVD) process. The DC power axis in FIG. 2A corresponds to a power utilized by the voltage source 104 in FIGS. 1A-1B. The pressure axis in FIG. 2A corresponds to a total pressure within the chamber 101 in FIGS. 1A-1B. In some embodiments, the process region 202 is bounded by 10 mT and 24 mT. In some embodiments, the process region 202 is bounded by 12 mT and 15 mT. In some embodiments, the process region 202 is bounded by 2000 W and 4000 W. In some embodiments, the process region 202 is bounded by 2000 W and 2500 W. In some embodiments, the DC power range is dependent on a size of the substrate 102, and the DC power range shown in FIG. 2A corresponds to a substrate 102 (e.g., a wafer) having an 8 inch diameter. In some embodiments, the DC power scales with size of the substrate. For example, the power is proportional to the surface area of the substrate ($\pi r^2$).

Figure 2B:
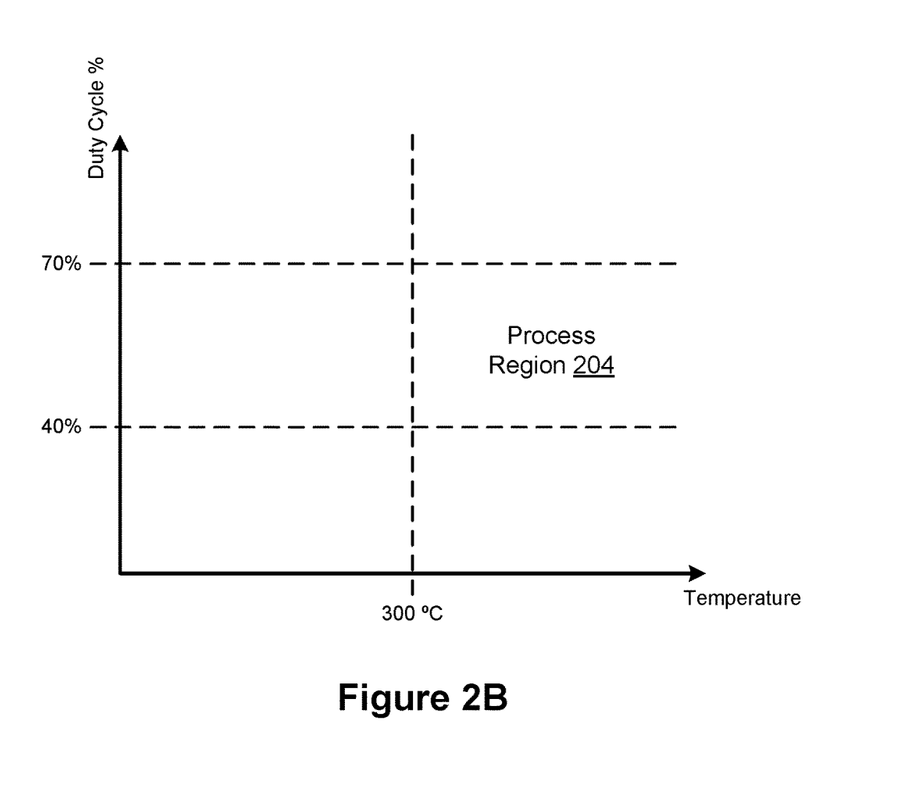

FIG. 2B shows another process region 204 for deposition of the superconductor layer. The temperature axis in FIG. 2B corresponds to a temperature of the substrate 102 in FIGS. 1A-1B. The duty cycle percentage (%) axis in FIG. 2B corresponds to a duty cycle utilized by the voltage source 104 in FIGS. 1A-1B (e.g., an "on" percentage for the voltage source). In some embodiments, the process region 204 is bounded by 40% duty cycle and 60% duty cycle. In some embodiments, the process region 204 is bounded by 300 degrees Celsius and 400 degrees Celsius. In some embodiments, the process region 204 is bounded by 350 degrees Celsius and 400 degrees Celsius.

Figure 3A:
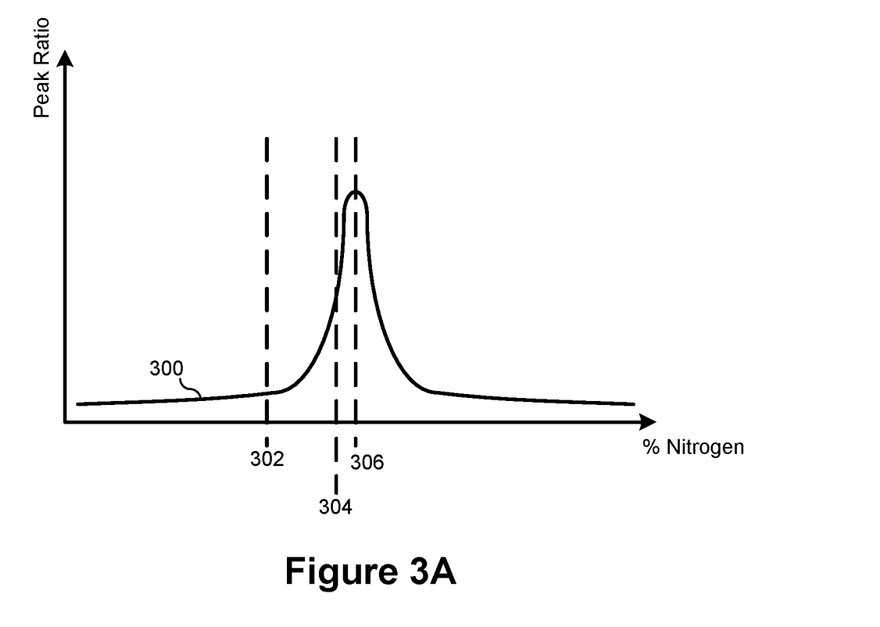
FIGS. 3A-3D are diagrams illustrating prophetic cubic phase peak ratios for a superconductor device in accordance with some embodiments.

FIGS. 3A-3D are diagrams illustrating prophetic cubic phase peak ratios for a superconductor device in accordance with some embodiments. FIG. 3A illustrates a prophetic graph of cubic peak ratios between a (111) lattice structure (e.g., corresponding to an angle, of x-ray scattering, of 35.5 degrees) and a (200) lattice structure (e.g., corresponding to an angle of 41.2 degrees) as a function of a percentage of nitrogen in the plasma 118 for a deposited superconductor. In some embodiments, the percentage of nitrogen in the plasma is varied between a lower bound (e.g., 5% or 10%) and an upper bound (e.g., 15%, 25%, or 50%). In some embodiments and circumstances, the (111)/(200) ratio correlates with a threshold superconducting temperature of the deposited superconductor (e.g., the higher the (111)/(200) ratio the higher the threshold superconducting temperature).

Figure 3B:
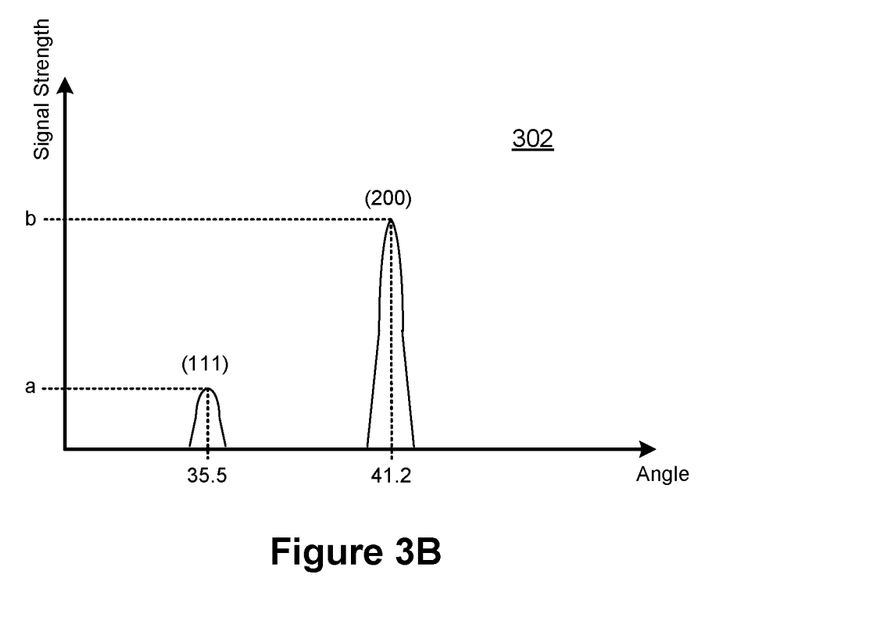
Figure 3C:
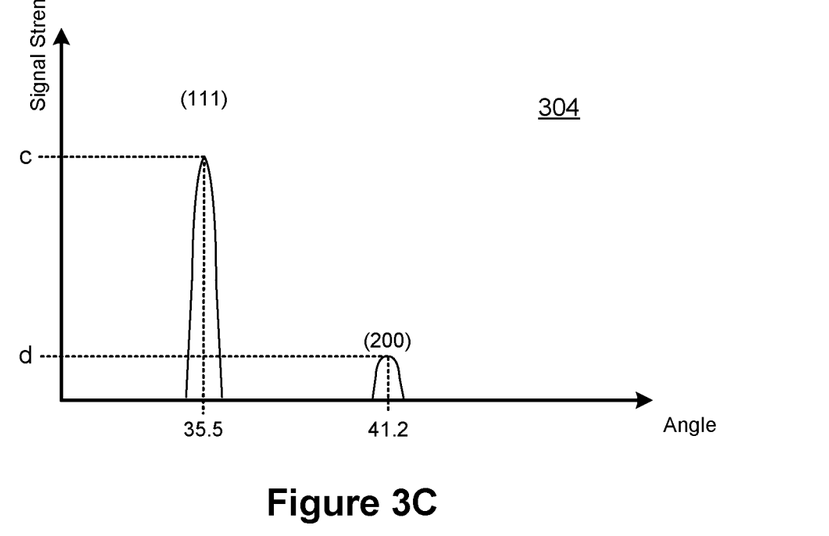
Figure 3D:
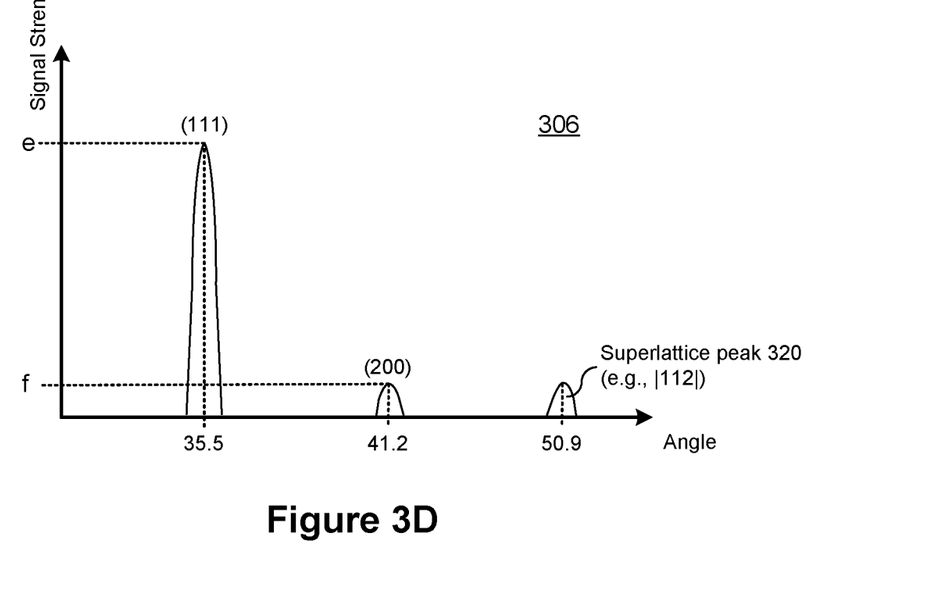

In some embodiments, the graphs shown in FIGS. 3B-3D correspond to x-ray diffraction spectra of the deposited superconductor. FIG. 3B shows cubic peaks (111) and (200) for a deposited superconductor produced using a plasma having the nitrogen percentage corresponding to point 302 in FIG. 3A. As illustrated in FIG. 3B the ratio (111)/(200) is a fraction having a value less than 1 (indicating a low threshold superconducting temperature). FIG. 3C shows cubic peaks (111) and (200) for a deposited superconductor produced using a plasma having the nitrogen percentage corresponding to point 304 in FIG. 3A. As illustrated in FIG. 3C the ratio (111)/(200) is a fraction having a value greater than 1 (indicating a higher threshold superconducting temperature than in FIG. 3B). FIG. 3D shows cubic peaks (111) and (200) for a deposited superconductor produced using a plasma having the nitrogen percentage corresponding to point 306 in FIG. 3A. As illustrated in FIG. 3D the ratio (111)/(200) is greater than the ratio (111)/(200) in FIG. 3B, indicating a higher threshold superconducting temperature for a deposited superconductor produced using a plasma having the nitrogen percentage corresponding to point 306 in FIG. 3A than a deposited superconductor produced using a plasma having the nitrogen percentage corresponding to points 302 and 304 in FIG. 3A. FIG. 3D also shows a superlattice peak 320 at an angle (of x-ray scattering) of 50.9 degrees (e.g., corresponding to a |112| superlattice). In some embodiments and circumstances, the presence of the superlattice peak 320 indicates a higher threshold superconducting temperature than x-ray diffraction spectra without the superlattice peak 320.

FIGS. 4A-4B are cross-sectional diagrams illustrating representative superconductor devices in accordance with some embodiments. FIG. 4A shows a cross-sectional view of a superconductor device 400 (e.g., a thick film superconductor). The superconductor device 400 includes a substrate 402 (e.g., a silicon wafer), a buffer layer 404 (e.g., composed of silicon nitride), and a superconductor layer 406 (e.g., composed of niobium nitride). In some embodiments, the thickness of the buffer layer 404, denoted $t_1$ in FIG. 4A, is in the range of 5 nanometers (nm) to 500 nm. In some embodiments, the thickness of the superconductor layer 406, denoted $t_2$ in FIG. 4A, is in the range of 40 nm to 1000 nm. In some embodiments, the thick film superconductor device 400 provides better x-ray diffraction spectra (e.g., to analyze to determine a preferred nitrogen percentage in the plasma used when depositing a superconductor layer) than a thin film superconductor. In some embodiments, the buffer layer 404 is deposited via a chemical vapor deposition process. In some embodiments, the superconductor layer 406 is deposited via a physical vapor deposition process (e.g., as illustrated in FIG. 1B).

FIG. 4B shows a cross-sectional view of a superconductor device 420 (e.g., a thin film superconductor). The superconductor device 420 includes the substrate 402, a buffer layer 408 (e.g., composed of silicon nitride), a second buffer layer 410 (e.g., composed of aluminum nitride), a superconductor layer 412 (e.g., composed of niobium nitride), and a protective layer 414 (e.g., composed of aluminum nitride). In some embodiments (not shown), the superconductor device 420 does not include the buffer layer 408 and/or the protective layer 414. In some embodiments, the thickness of the buffer layer 408, denoted $t_3$ in FIG. 4B, is in the range of 5 nm to 500 nm. In some embodiments, the thickness of the buffer layer 410, denoted $t_4$ in FIG. 4B, is in the range of 3 nm to 50 nm. In some embodiments, the thickness of the superconductor layer 412, denoted $t_4$ in FIG. 4B, is in the range of 4 nm to 20 nm (e.g., in the range of 4 nm to 6 nm). In some embodiments, the thickness of the protective layer, denoted to in FIG. 4B, is in the range of 1 nm to 5 nm.

Figure 5A:
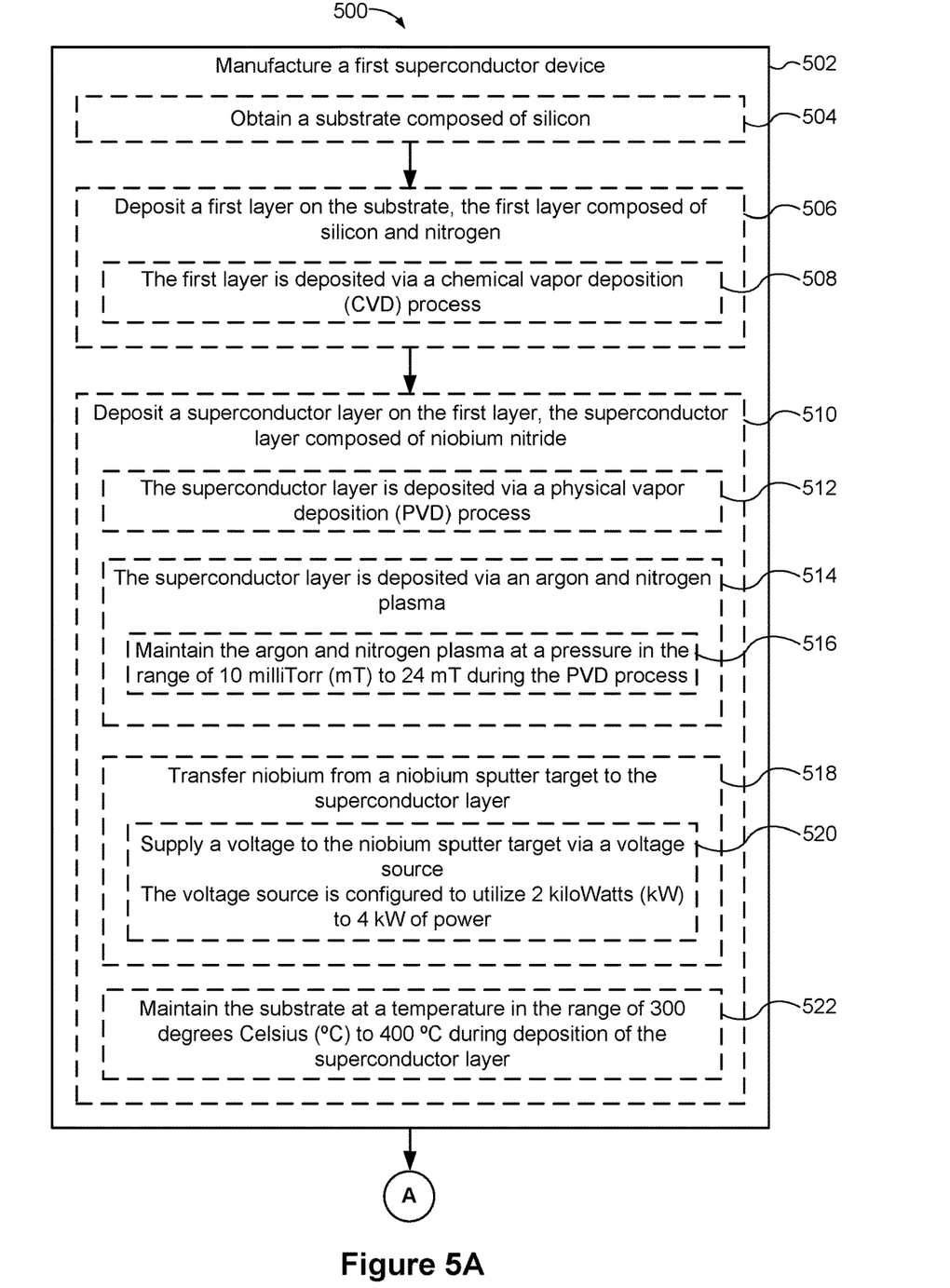
FIGS. 5A-5C are flow diagrams illustrating a representative method of manufacturing superconductor devices in accordance with some embodiments.
Figure 5B:
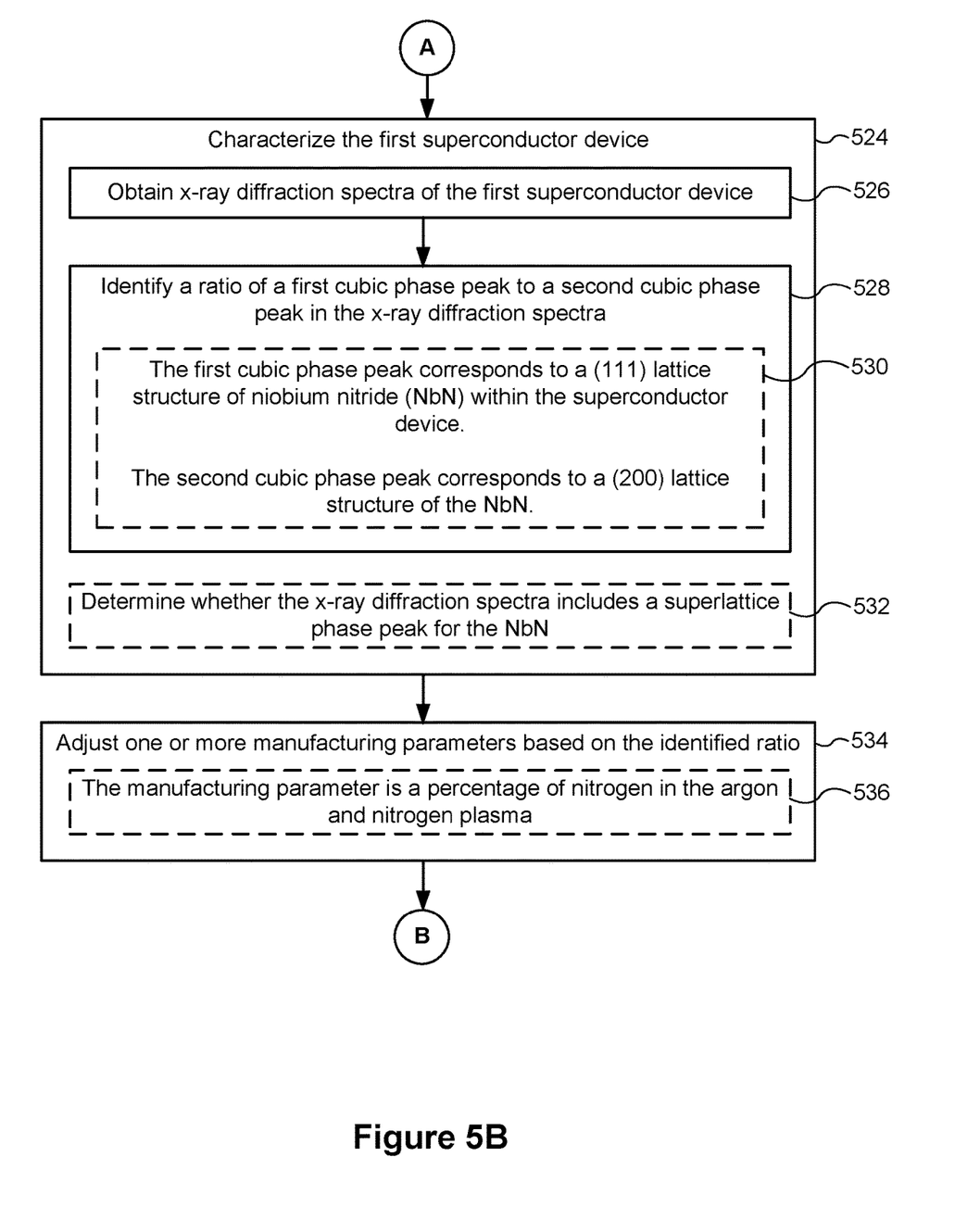
Figure 5C:
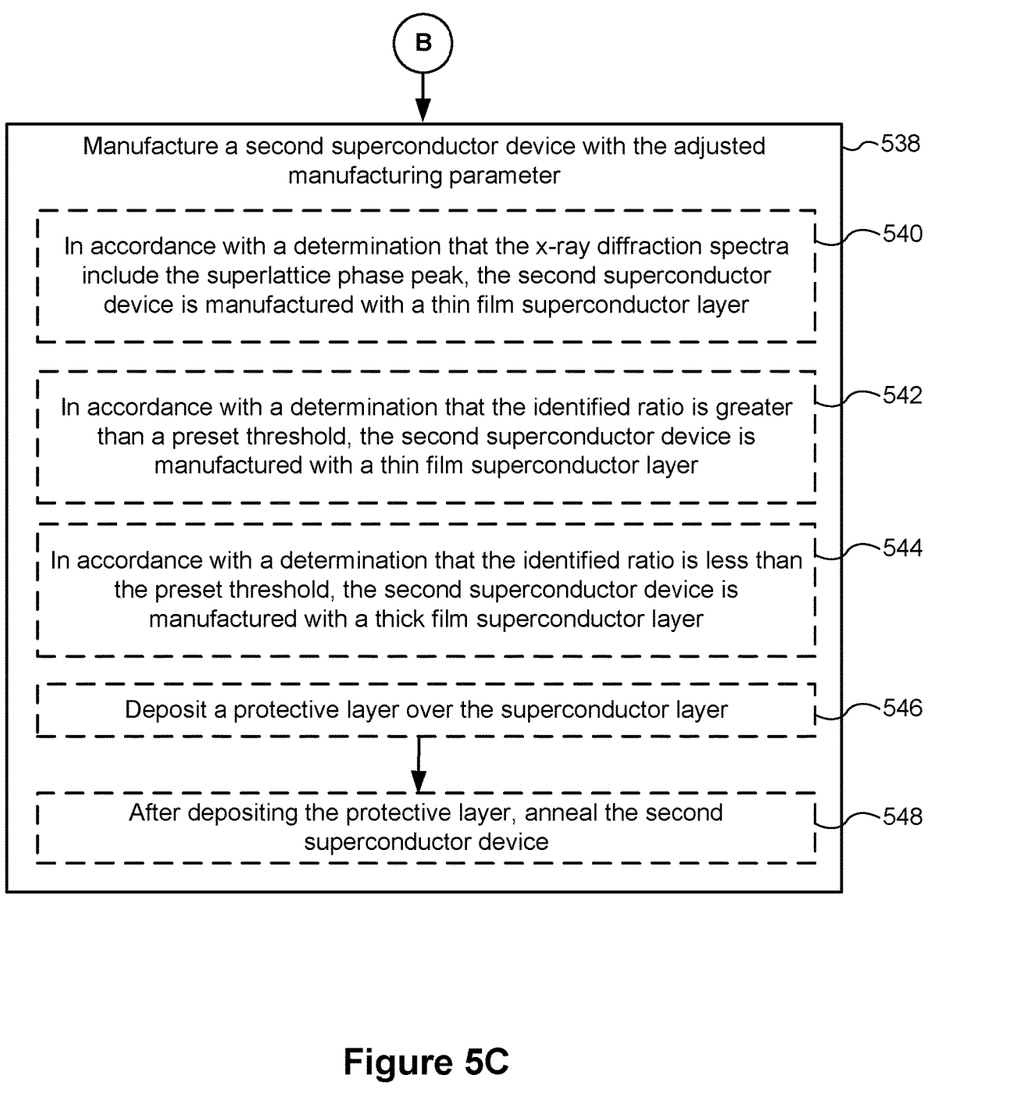

FIGS. 5A-5C are flow diagrams illustrating a method 500 of manufacturing superconductor devices in accordance with some embodiments. In some embodiments, the method 500 is performed with a manufacturing system (e.g., the manufacturing system 100, FIG. 1A). In some embodiments, the manufacturing system includes a physical vapor deposition (PVD) tool and/or a chemical vapor deposition (CVD) tool.

The method 500 includes manufacturing (502) a first superconductor device. In some embodiments, the first superconductor device includes a thick film superconductor layer (e.g., a superconductor layer having a thickness greater than 50 nm, 40 nm, or 30 nm). In some embodiments, the first superconductor device includes a silicon substrate, a buffer layer composed of silicon nitride, and a superconductor layer composed of niobium nitride. For example, the first superconductor is the superconductor device 400 (FIG. 4A).

In some embodiments, manufacturing the first superconductor device includes obtaining (504) a substrate composed of silicon (e.g., a 8 inch diameter silicon wafer). In some embodiments, manufacturing the first superconductor device includes depositing (506) a first layer (e.g., the buffer layer 404, FIG. 4A) on the substrate, the first layer composed of silicon and nitrogen (e.g., composed of silicon nitride). In some embodiments, the first layer has a thickness in the range of 5 nm to 500 nm. In some embodiments, the first layer is deposited via a chemical vapor deposition (CVD) process (508).

In some embodiments, manufacturing the first superconductor device includes depositing (510) a superconductor layer on the first layer, the superconductor layer composed of niobium nitride. In some embodiments, the superconductor layer is deposited using the manufacturing system 100 discussed above with reference to FIG. 1B. In some embodiments, the manufacturing is performed with CMOS BEOL processes and tools (e.g., a 200 mm+ CMOS tool).

In some embodiments, the superconductor layer is deposited via a physical vapor deposition (PVD) process (512), e.g., a reactive sputter deposition process. In some embodiments, the superconductor layer is deposited via an argon and nitrogen plasma (514), such as the plasma 118 in FIG. 1B. In some embodiments, the argon is replaced with a different noble gas. In some embodiments, the argon and nitrogen plasma is maintained (516) at a pressure in the range of 10 milliTorr (mT) to 24 mT during the PVD process. In some embodiments, the pressure is maintained via selectively opening and closing the inlets 106 and 108 and the outlet 112.

In some embodiments, depositing the superconductor layer includes transferring (518) niobium from a niobium sputter target (e.g., the sputter target 110, FIG. 1B) to the superconductor layer. In some embodiments, transferring the niobium includes supplying (520) a voltage to the niobium sputter target via a voltage source, where the voltage source is configured to utilize 2 kiloWatts (KW) to 4 kW of power (e.g., supplies a voltage greater than 1000 volts). In some embodiments, the voltage source comprises a pulsed direct current (DC) voltage source. In some embodiments, the pulsed DC voltage source has a duty cycle in the range of 40% and 70%. In some embodiments, transferring the niobium includes maintaining (522) the substrate at a temperature in the range of 300 degrees Celsius (° C.) to 400° C. during deposition of the superconductor layer.

The method 500 includes characterizing (524) the first superconductor device. Characterizing the first superconductor device includes obtaining (526) x-ray diffraction spectra of the first superconductor device. Characterizing the first superconductor device also includes identifying (528) a ratio of a first cubic phase peak to a second cubic phase peak in the x-ray diffraction spectra. In some embodiments, the first cubic phase peak corresponds (530) to a (111) lattice structure of niobium nitride (NbN) within the superconductor device, and the second cubic phase peak corresponds to a (200) lattice structure of the NbN. For example, the ratio illustrated in FIGS. 3A-3D. In some embodiments, characterizing the first superconductor device includes determining (532) whether the x-ray diffraction spectra includes a superlattice phase peak for the NbN (e.g., the superlattice peak 320, FIG. 3D). In some embodiments, characterizing the first superconductor device includes determining whether the superlattice peak has a signal strength that is at least 30% of the signal strength of the (200) peak. In some embodiments, characterizing the first superconductor device includes determining whether a ratio of the superlattice peak to the (200) peak is at least a preset value (e.g., at least 1/4, 1/3, or 1/2).

The method 500 includes adjusting (534) one or more manufacturing parameters based on the identified ratio. In some embodiments, the one or more manufacturing parameters include (536) a percentage of nitrogen in the argon and nitrogen plasma (e.g., adjusting the percentage of nitrogen in the range of 5% to 50%). In some embodiments, the percentage of nitrogen in the plasma is varied between a lower bound (e.g., 5% or 10%) and an upper bound (e.g., 15%, 25%, or 50%) for a series of superconductor devices. For example, the nitrogen percentage is increased by 1% for each subsequent superconductor device (until a desired ratio is achieved). In some embodiments, the one or more manufacturing parameters include a duty cycle of a DC voltage source (e.g., the voltage source 104, FIG. 1B). For example, the duty cycle is adjusted within a range of 40% to 70%, or within a range of 40% to 60%. In some embodiments, the one or more manufacturing parameters include a wattage of the voltage source (e.g., the voltage source 104, FIG. 1B). For example, the wattage is adjusted within a range of 2 kW to 4 kW, or a range of 2 kW to 2.5 kW. In some embodiments, the one or more manufacturing parameters include a total pressure for the argon and nitrogen plasma (e.g., the plasma 118). For example, the total pressure is adjusted within a range of 10 mT to 24 mT, or a range of 12 mT to 15 mT. In some embodiments, the one or more manufacturing parameters include a temperature of the substrate (e.g., the substrate 102). For example, the temperature of the substrate is adjusted within a range of 300 degrees Celsius to 400 degrees Celsius, or a range of 350 degrees Celsius to 400 degrees Celsius. In some embodiments, the one or more manufacturing parameters include a thickness of the superconductor layer. For example, the thickness is adjusted from greater than 40 nm to less than 40 nm.

The method 500 includes manufacturing (538) a second superconductor device with the adjusted manufacturing parameter. In some embodiments, in accordance with a determination that the x-ray diffraction spectra include the superlattice phase peak (540), the second superconductor device is manufactured with a thin film superconductor layer (e.g., having a thickness less than 30 nm, 40 nm, or 50 nm). For example, the second superconductor device is manufactured with a superconductor layer having a thickness less than a predefined thickness. In some embodiments, the predefined thickness is a thickness value of 30 nm to 50 nm. In some embodiments, in accordance with a determination that the identified ratio is greater than a preset threshold (542), the second superconductor device is manufactured with a thin film superconductor layer (e.g., having a thickness less than 30 nm, 40 nm, or 50 nm). In some embodiments, the preset ratio threshold is a value in the range of 5 to 10. In some circumstances, a ratio greater than the preset threshold corresponds to a high threshold superconducting temperature (e.g., a $T_C \geq 15$ Kelvin) for the superconductor device manufactured using the above-described manufacturing process. In some embodiments, a ratio greater than the preset threshold corresponds to a $T_C \geq 15$ Kelvin for a thick superconductor device (e.g., with a superconductor layer having a thickness of at least 40 nm) and a $T_C \geq 12$ Kelvin for a thin supercenter device (e.g., with a superconductor layer having a thickness below 40 nm, e.g., in the range of 4 nm to 6 nm). In some embodiments, in accordance with a determination that the identified ratio is less than the preset threshold (544), the second superconductor device is manufactured with a thick film superconductor layer (e.g., having a thickness greater than 30 nm, 40 nm, or 50 nm).

In some embodiments, manufacturing the second superconductor device includes depositing (546) a protective layer (e.g., the protective layer 414, FIG. 4B) over the superconductor layer. In some embodiments, the protective layer is composed of aluminum nitride. In some embodiments, the protective layer has a thickness in the range of 1 nm to 5 nm. In some embodiments, the protective layer is adapted to prevent oxidation of the superconductor layer. In some embodiments, manufacturing the second superconductor device includes, after depositing the protective layer, annealing (548) the second superconductor device. In some embodiments, addition of the protective layer allows for annealing of the superconductor device without damage to the superconductor layer. In some embodiments, the annealing includes annealing via an ex-situ annealing process with temperatures in the range of 500 degrees Celsius to 700 degrees Celsius.

As an example, the method 500 may include manufacturing multiple thick film superconductor devices (e.g., superconductor devices 400), each manufactured using a deposition process having a plasma with a distinct nitrogen percentage. In this example, the thick film superconductor devices are characterized until one is found to have a (111)/(200) ratio greater than a preset threshold (e.g., greater than 5, 6, or 7). Once a thick film superconductor device is determined to have a ratio in excess of the preset threshold, the corresponding manufacturing parameters are identified and/or recorded, and a thin film superconductor device (e.g., superconductor devices 420) is manufactured using the identified/recorded manufacturing parameters of the thick film superconductor device.

It will also be understood that, although the terms first, second, etc. are, in some instances, used herein to describe various elements, these elements should not be limited by these terms. These terms are only used to distinguish one element from another. For example, a first current could be termed a second current, and, similarly, a second current could be termed a first current, without departing from the scope of the various described embodiments. The first current and the second current are both currents, but they are not the same condition unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, a "superconducting circuit" or "superconductor circuit" is a circuit having one or more superconducting materials. For example, a superconductor switch circuit is a switch circuit that includes one or more superconducting materials. As used herein, a "superconducting" material is a material that is capable of operating in a superconducting state (under particular conditions). For example, a superconducting material is a material that operates as a superconductor (e.g., operates with zero electrical resistance) when cooled below a particular temperature (e.g., a threshold temperature) and having less than a threshold current flowing through it. A superconducting material is also sometimes called herein a superconduction-capable material. In some embodiments, the superconducting materials operate in an "off" state where little or no current is present. In some embodiments, the superconducting materials can operate in a non-superconducting state during which the materials have a non-zero electrical resistance (e.g., a resistance in the range of one thousand to ten thousand ohms). For example, a superconducting material supplied with a current greater than a threshold superconducting current for the superconducting material transitions from a superconducting state having zero electrical resistance to a non-superconducting state having non-zero electrical resistance.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claims is:

1. A method of manufacturing, comprising:
   manufacturing a first superconductor device;
   generating x-ray diffraction spectra data from the first superconductor device;
   identifying a first peak ratio between a first phase peak and a second phase peak in the x-ray diffraction spectra data;
   generating additional x-ray diffraction spectra data from a second superconductor device;
   identifying a second peak ratio of the additional x-ray diffraction spectra data from the second superconductor device;
   adjusting a manufacturing parameter based on the first peak ratio and the second peak ratio; and
   manufacturing a third superconductor device based on the adjusted manufacturing parameter.

2. The method of claim 1, wherein the manufacturing parameter corresponds to one or more of: a voltage source, a duty cycle, a pressure, and a plasma mixture.

3. The method of claim 1, wherein manufacturing the first superconductor device comprises obtaining a substrate structure, the substrate structure comprising silicon.

4. The method of claim 3, further comprising depositing a superconductor layer of superconductor material on the substrate structure.

5. The method of claim 4, wherein the superconductor layer is deposited in a chamber via vapor deposition.

6. The method of claim 5, wherein the superconductor layer is deposited using a plasma in the chamber.

7. The method of claim 6, wherein the manufacturing parameter comprises a percentage of nitrogen in the plasma.

8. The method of claim 6, further comprising maintaining a pressure of the plasma in the chamber during deposition of the superconductor layer.

9. The method of claim 1, wherein the first phase peak and the second phase peak correspond to a lattice structure of superconducting material in the first superconductor device.

10. The method of claim 9, further comprising determining that the x-ray diffraction spectra data of the first superconductor device comprises a superlattice peak.

11. The method of claim 10, wherein determining that the x-ray diffraction spectra data comprises the superlattice peak comprises:
    determining that a signal strength of the superlattice peak is higher than another signal strength of the second phase peak of the first superconductor device.

12. The method of claim 11, wherein determining that the x-ray diffraction spectra data comprises the superlattice peak comprises determining that the signal strength of the superlattice peak is at least 30% higher than the another signal strength of the second phase peak.

13. The method of claim 10, wherein the third superconductor device is manufactured with a thickness of less than 40 nanometers based on the x-ray diffraction spectra data of the first superconductor device comprising the superlattice peak.

14. The method of claim 11, wherein the first superconductor device comprises a superconductor layer with a thickness greater than 40 nanometers.

* * * * *